United States Patent [19]

Mashiko et al.

[11] Patent Number: 4,734,889
[45] Date of Patent: Mar. 29, 1988

[54] SEMICONDUCTOR MEMORY

[75] Inventors: Koichiro Mashiko; Yoshikazu Morooka; Tadato Yamagata; Yuto Ikeda, all of Itami, Japan

[73] Assignee: Mitsubishi Denki Kabushiki Kaisha, Tokyo, Japan

[21] Appl. No.: 837,359

[22] Filed: Mar. 6, 1986

[30] Foreign Application Priority Data

Mar. 22, 1985 [JP] Japan .................. 60-59234

[51] Int. Cl.[4] ............. G11C 13/00; G11C 11/40
[52] U.S. Cl. ................... 365/200; 365/203; 365/210
[58] Field of Search ............. 365/200, 203, 210

[56] References Cited

U.S. PATENT DOCUMENTS

| 4,586,170 | 4/1986 | O'Toole et al. | 365/200 |
| 4,592,027 | 5/1986 | Masaki | 365/203 |
| 4,601,017 | 7/1986 | Mochizuki et al. | 365/203 |

OTHER PUBLICATIONS

"THPM 12.6: A Fault-Tolerant 64K Dynamic RAM", Ronald P. Cenker et al; IEEE, Digest of Technical Papers, 1979, ISSCC, pp. 150-151 & 290.

Primary Examiner—Terrell W. Fears
Attorney, Agent, or Firm—Lowe, Price, LeBlanc, Becker & Shur

[57] ABSTRACT

A spare Y decoder is provided with MOS transistors 14 and 20 for charge on both sides of a parasitic resistor 19. As a result, nodes N1 and N2 are rapidly charged by the MOS transistors 20 and 14 for charge, respectively.

6 Claims, 5 Drawing Figures and a dummy word line $\overline{DWL}$. In the following description, the respective last reference characters 1 through n of the word lines $\overline{WL1}$ through $\overline{WLn}$ and $\overline{WL1}$ through $\overline{WLn}$ and the respective last reference characters 1 through i of the bit lines $\overline{BL1}$ through BLi and BL1 through $\overline{BLi}$ will be omitted if any particular confusion does not occur.

SEMICONDUCTOR MEMORY

BACKGROUND OF THE INVENTION

1. Field of the Invention

The present invention relates to a semiconductor memory and particularly to a dynamic semiconductor memory (referred to hereinafter as a dynamic RAM) of a redundant design.

2. Description of the Prior Art

FIG. 2 is an equivalent circuit diagram of a memory cell array of a conventional dynamic RAM shown in the journal of the Institute of Electronics and Communication Engineers of Japan (Vol. 67, No. 11, pp. 1151–1160). In the figure, bit lines BL1 through BLi are provided so as to be perpendicular to word lines WL1 through WLn and a dummy word line DWL. On the other hand, bit lines $\overline{BL1}$ through $\overline{BLi}$ are provided so as to be perpendicular to word lines $\overline{WL1}$ through $\overline{WLn}$ and a dummy word line $\overline{DWL}$. In the following description, the respective last reference characters 1 through n of the word lines $\overline{WL1}$ through $\overline{WLn}$ and $\overline{WL1}$ through $\overline{WLn}$ and the respective last reference characters 1 through i of the bit lines $\overline{BL1}$ through BLi and BL1 through $\overline{BLi}$ will be omitted if any particular confusion does not occur.

At the positions where the word lines WL and $\overline{WL}$ cross the bit lines BL and $\overline{BL}$, memory cells MC are provided. At the positions where the dummy word lines DWL and $\overline{DWL}$ cross the bit lines BL and $\overline{BL}$, dummy memory cells DC are provided. Sense amplifiers SA are interposed between the respective bit lines BL and $\overline{BL}$. An X decoder (row decoder) 1 is connected to the word lines WL and WL. A dummy word line decoder 2 is connected to the dummy word lines DWL and $\overline{DWL}$. The respective bit lines BL and $\overline{BL}$ are connected to power supply lines Vcc through MOS transistors 13 for precharge. A clock signal $\phi2$ is applied to the respective gates of the MOS transistors 13. The respective bit lines BL are connected to a bus line I/O through MOS transistors 10 and the respective bit lines $\overline{BL}$ are connected to a bus line $\overline{I/O}$ through MOS transistors 11. The associated gates of these MOS transistors 10 and 11 are connected commonly and any of the decoded outputs Y1 through Yi of a Y decoder (column decoder) 21 is applied to the commonly connected gates. The bus lines I/O and $\overline{I/O}$ are connected to an output buffer 12 for signal amplification.

Each of the above described memory cells MC comprises a MOS transistor 5 and a storage capacitor 6. The drain of each MOS transistor 5 is connected to a bit line BL or $\overline{BL}$, the gate thereof is connected to a word line WL or $\overline{WL}$ and the source thereof is connected to one electrode of each storage capacitor 6. The other electrode of each storage capacitor 6 is connected to a fixed voltage source (a ground potential in this case).

Each of the above described dummY memory cells DC comprises MOS transistors 7 and 9 and a dummy capacitor 8. The drain of each MOS transistor 7 is connected to a bit line BL or $\overline{BL}$, the gate thereof is connected to a dummy word line DWL or $\overline{DWL}$ and the source thereof is connected to one electrode of a dummy capacitor 8. The other electrode of each dummy capacitor 8 is connected to a fixed voltage source (a ground potential in this case). The drain of each MOS transistor 9 is connected to one electrode of a dummy capacitor 8, the gate thereof receives a clock signal $\phi1$ and the source thereof is connected to a fixed voltage source (a ground potential in this case).

Each of the above described sense amplifiers SA comprises MOS transistors 3 and 4. The drain of each MOS transistor 3 is connected to a bit line BL, the gate thereof is connected to a bit line $\overline{BL}$ and the source thereof receives a sense amplifier activation signal $\overline{SE}$. The drain of each MOS transistor 4 is connected to a bit line $\overline{BL}$ and the gate thereof is connected to a bit line BL, the source thereof receiving a sense amplifier activation signal $\overline{SE}$.

Now, referring to a timing chart in FIG. 3, the operation of the memory cell array shown in FIG. 2 will be described.

First of all, the MOS transistors 13 are turned on by the clock signal $\phi2$ so that all the bit lines BL and $\overline{BL}$ are charged at the power supply potential (Vcc). At the same time, the MOS transistors 9 are turned on by the clock signal $\phi1$ having almost the same phase as that of the clock signal $\phi2$ so that the dummy capacitors 8 are discharged. The state thus established is the initial state.

Then, an X address (row address) is latched by an Ext. $\overline{RAS}$ clock signal (an external row address strobe clock signal) and according to the combination of the latched X address, the X decoder 1 selects a word line, for example, WLn. A drive voltage is applied to the selected word line WLn so that a signal voltage corresponding to the stored information is applied from all the memory cells MC associated with the word line WLn to the bit lines BL through the MOS transistors 5. Each dummy capacitor 8 has a capacitance value approximately half of that of each storage capacitor 6 and is adapted to generate as a reference voltage an intermediate voltage of the signal voltage corresponding to the stored information "1" or "0" of each storage capacitor 6. The stored information "1" or "0" is determined dependent on the magnitude of the storage capacitor signal voltage corresponding to the reference voltage. The difference of the signal voltage is usually very small and therefore the sense amplifier activation signal $\overline{SE}$ is made to fall to activate the sense amplifiers, whereby differential amplification is performed.

On the other hand, a Y address (column address) is latched by an Ext. $\overline{CAS}$ clock signal (an external column address strobe clock signal) and any of the decoded outputs (any of Y1 to Yi) of the Y decoder is applied corresponding to a sense amplifier SA designated by the Y decoder 21 according to the combination of the latched Y addresses. Accordingly, the MOS transistors 10 and 11 are conducted and the signal voltage amplified by the selected amplifier SA is read out onto the bus lines I/O and $\overline{I/O}$ so as to be supplied as data output to the exterior from the output buffer circuit 12.

The above described operation is the reading operation from the memory cells MC. Writing operation is performed reversely.

More specifically, a voltage corresponding to the input data is applied to the bus lines I/O and $\overline{I/O}$ as a complementary signal and then is applied to the bit lines BL and $\overline{BL}$ selected by the Y decoder 21 as a complementary signal. Subsequently, it is written as information in the desired memory cells connected to the word lines WL or $\overline{WL}$ selected by the X decoder 1.

In such a memory cell array as described above, the bit lines BL and $\overline{BL}$ occupy most region of a dynamic RAM and a considerably large portion of the bit lines BL and $\overline{BL}$ is formed by diffused layer connections of a conductivity type opposite to that of the semiconductor substrate. In consequence, a large stray capacitance exists between the bit lines BL and $\overline{BL}$ and the substrate and as a result, an electrical coupling noise is superimposed onto the potential of the substrate. Accordingly, the clock signals $\phi 2$ rises and the potential $V_{BB}$ of the substrate is also increased with the timing for charging the bit lines BL and $\overline{BL}$. Further, as shown in FIG. 3, the sense amplifier activation signal $\overline{SE}$ falls to activate the sense amplifiers SA and the potential $V_{BB}$ of the substrate is lowered as a result of discharging of the bit lines on either side, that is, BL or $\overline{BL}$.

The above described phenomenon (a bounce of $V_{BB}$) is exhibited conspicuously in a dynamic RAM containing a substrate potential generating circuit because a negative voltage is applied to the back surface of a P type substrate for purposes of stabilization of the circuit operation. In some cases, the substrate potential anplitude attains 1 V.

Analyses and measures to be taken concerning erroneous operation due to a bounce of $V_{BB}$ are already presented in a document published by McGraw-Hill Inc. (Electronics Nov. 17, 1982, pp. 155-159). However, the recent tendency toward fine layout patterns of a dynamic RAM causes a new problem.

For example, if the timing of a bounce of the substrate potential $V_{BB}$ in the positive direction and the timing for charging the respective nodes in a chip are not adjusted in the most suitable manner in a conventional dynamic RAM, it is feared that the potential of the nodes to be charged in the circuit block which operates after activation of the sense amplifiers SA is not sufficiently raised, causing inconvenience to normal operation.

This problem becomes serious particularly in precharging a spare decoder used for a redundant design which tends to be adopted for the purpose of improving the yield according to the trend to a large capacity of a dynamic RAM. Spare decoders are described in detail in the document (Digest of Technical Papers, 1979, IEEE, ISSCC, pp. 150-151). Referring to the spare Y decoder shown in FIG. 4 and the timing chart thereof shown in FIG. 5, the structure and the operation of a conventional spare Y decoder as well as the problems involved therein will be described.

The spare Y decoder shown in the figure is provided apart from a regular Y decoder 21 and is structured so that a decoded output (for example Yi) is provided onlY when a Y address corresponding to a defective address (the address of a defective memory cell detected beforehand by a test) is applied thereto. As shown in FIG. 4, the spare Y decoder comprises five MOS transistors 15 for receiving a Y address YA0 to YA4 at the gates thereof and five MOS transistors 15' for receiving at the gates thereof a complementary Y address signal $\overline{YA0}$ to $\overline{YA4}$ having a complementary relationship with the Y address signal YA0 to YA4. Although the Y address includes 5 bits in this case, the number of bits is determined according to the number of bit lines BL and $\overline{BL}$ (see FIG. 2) and is not limited to 5. It goes without saying that if the number of bits of the Y address is changed, the number of MOS transistors 15 and 15' is changed accordingly. The sources of the MOS transistors 15 and 15' are connected commonly and grounded. The drains of the MOS transistors 15 and 15' are connected commonly to a node N1 through fuses 16 and 16'.

On the other hand, a MOS transistor 14 for charge is provided between a power supply line Vcc and a node N2. A clock signal $\phi 3$ is applied to the gate of the MOS transistor 14. The node N2 is connected to the above stated node N1 as well as to the gate of an output MOS transistor 18 through a MOS transistor 17. The power supply line Vcc is connected to the gate of the MOS transistor 17. One conductive electrode of the MOS transistor 18 receives a clock signal $\phi Y$. From the other conductive electrode thereof, a decoded output (for example Yi) is obtained.

Now let us assume that either the fuse 16 or the fuse 16' for each bit of the Y address is melted in advance by a laser light or the like. In consequence of this, the Y address based on which the spare Y decoder is to operate is programmed. For example, if the Y address $\overline{YA0}$ to $\overline{YA4}$ corresponding to the defective address is "1, 1, 0, 1, 0" (the complementary Y address YA0 to YA4 in this case being "0, 0, 1, 0, 1"), the fuses 16 of the first bit, the second bit and the fourth bit are melted and the fuses 16' of the third bit and the fifth bit are melted.

The nodes N1 and N2 are charged by the MOS transistor 14 before a Y address is applied thereto. If the Y address applied thereto after that is not the programmed address, the MOS transistor 15 or 15' corresponding to the bit not coincident with the programmed address is turned on and the nodes N1 and N2 are grounded whereby the potential at the nodes N1 and N2 are lowered. As a result, the MOS transistor 18 is not turned on and a decoded output is not obtained. On the other hand, if the input Y address is the programmed address, that is, the address corresponding to the defective address, the MOS transistors 15 and 15' are all turned off and the potential at the nodes N1 and N2 is maintained. Consequently, the MOS transistor 18 is turned on and the clock signal $\phi Y$ is obtained as a decoded output Yi.

The decoded output thus obtained serves to forbid the selection of memory cells by the regular Y decoder 21 and to select memory cells provided as spare ones (not shown) in the memory cell array.

As compared with the regular Y decoder 21, the spare Y decoder further comprises the MOS transistors 15' and the fuses 16 and 16'. As a result, the spare Y decoder can not be contained in the memory cell array according to the pitches of layout of the regular Y decoder 21 and is usually located outside the memory cell array. In consequence, a parasitic resistor 19 having a large value exists between the nodes N1 and N2. The MOS transistor 14 for charging the nodes N1 and N2 is generally connected to either end of the parasitic resistor 19. A problem caused in such a case will be described referring to the timing chart in FIG. 5.

As shown in the timing chart in FIG. 5, the timing of rise of the clock signal $\phi 3$ and the timing of bounce of the substrate potential VBB in the positive direction occur almost simultaneously if the rise of the signal Ext. $\overline{CAS}$ occurs slower than the rise of the signal Ext. $\overline{RAS}$. If the clock signal $\phi 3$ rises, charging of the nodes N1 and N2 starts. However, since the parasitic resistor 19 having a large resistance value exists between the nodes N1 and N2 as described above, the node N1 is charged more slowly compared with the node N2. Since a junction capacitance exists between the nodes N1 and N2 and the substrate, the nodes N1 and N2 are affected by the coupling of the bounce of the substrate potential VBB. If the coupling due to the bounce of the substrate potential VBB in the positive direction and charging by the clock signal $\phi 3$ occur simultaneously, the potential of the node N2 charged rapidly is sufficiently increased to Vcc-VTH or more, while the potential of the node N1 having a large CR time constant and charged slowly is increased only to an intermediate level.

The worst condition is that charging by the clock signal $\phi 3$ occurs after the bounce of the substrate potential and in this worst condition, the potential of the node N1 is not sufficiently increased and is maintained at Vcc-VTH.

After the charging, the potential of the node N2 is absorbed by the node N1 through the parasitic resistor 19. Since the potential of a node N3 is also connected to the node N2 through the MOS transistor 17, the node N3 is not sufficiently charged and remains at Vcc-VTH as in the case of the node N1.

At the subsequent cycle, the clock signal $\phi 3$ falls and the sense amplifiers are activated to bounce the substrate potential $V_{BB}$ in the negative direction. Then, due to the coupling by the bounce, the potentials of the nodes N1, N2 and N3 are further lowered.

In FIG. 5, the solid lines represent the waveforms in case where the spare Y decoder is selected and the broken lines represent the waveforms in case where the spare Y decoder is not selected.

In case where the spare Y decoder is selected, the nodes N1, N2 and N3 are not discharged and the clock signal $\phi Y$ is applied to the MOS transistor 18. The potential of the node N3 is increased by the self-bootstrap effect due to the gate capacitance of the MOS transistor 18 and the MOS transistor 18 is intensely conducted whereby thedecoded output Yi of the spare Y decoder rises. However, if the potential of the node N2 is lower than Vcc-VTH, the MOS transistor 17 is conducted and the potential of the node N3 is gradually lowered. Then, the decoded output Yi of the spare Y decoder is lowered due to various leakage currents and the like and the ON resistance between the MOS transistors 10 and 11 connecting the bit lines BL and $\overline{BL}$ and the bus lines I/O and $\overline{I/O}$ as shown in FIG. 2 is increased, which causes the margin of application of timing to be narrowed.

SUMMARY OF THE INVENTION

Therefore, an object of the present invention is to provide a semiconductor memory which can operate stably with a wide margin of application of timing.

Briefly stated, the present invention is a semiconductor memory of a redundant design having the spare decoder in which a plurality of charging means are provided for the spare decoder.

According to the present invention, the nodes of a spare decoder can be charged rapidly if the timing for charging the nodes of the spare decoder is not applied most suitably and therefore a semiconductor memory capable of operating stably with a wide margin of application of timing can be obtained.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
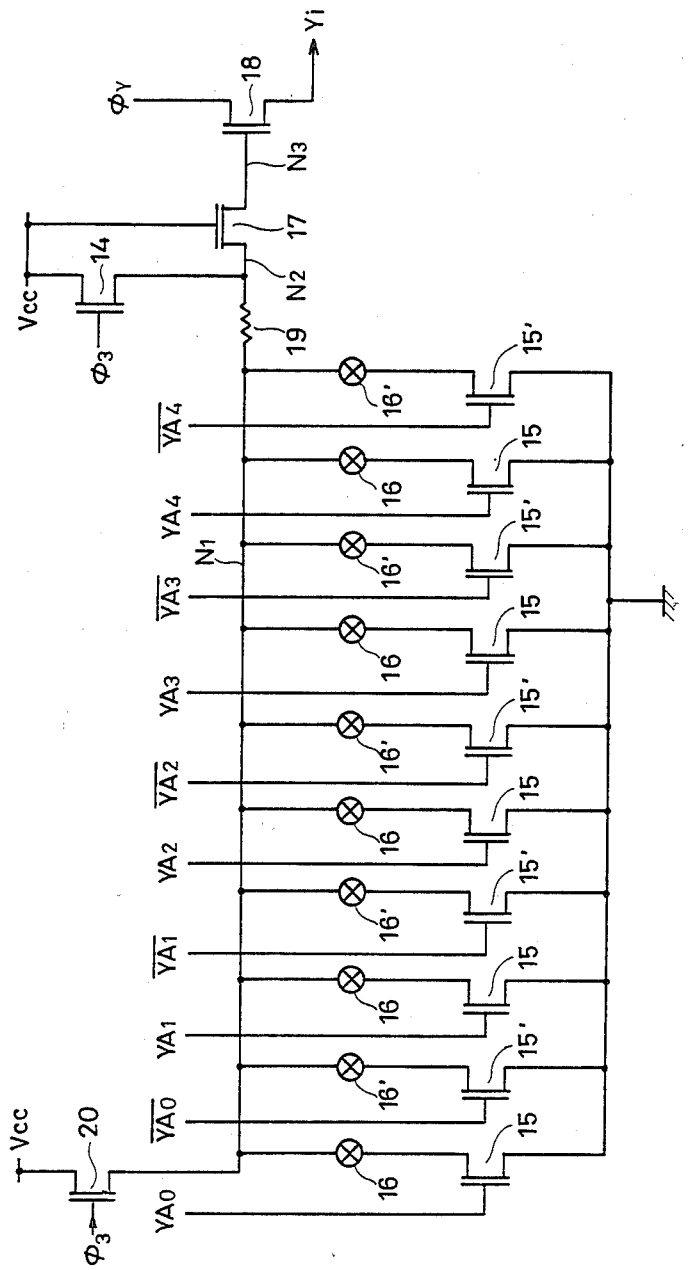
FIG. 1 is a circuit diagram showing a spare Y decoder in a semiconductor memory in accordance with an embodiment of the present invention.
Figure 2:
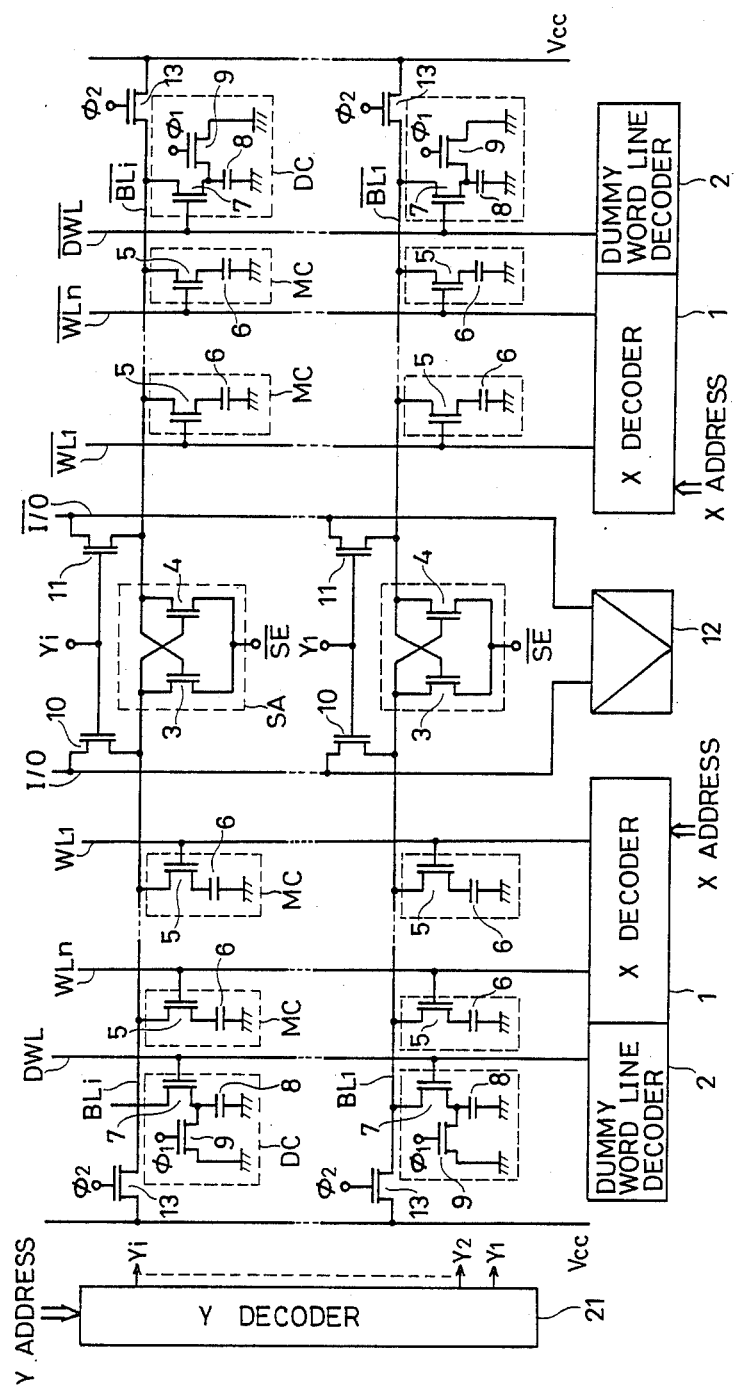
FIG. 2 is an equivalent circuit diagram of a memory cell array of a conventional dynamic RAM.
Figure 3:
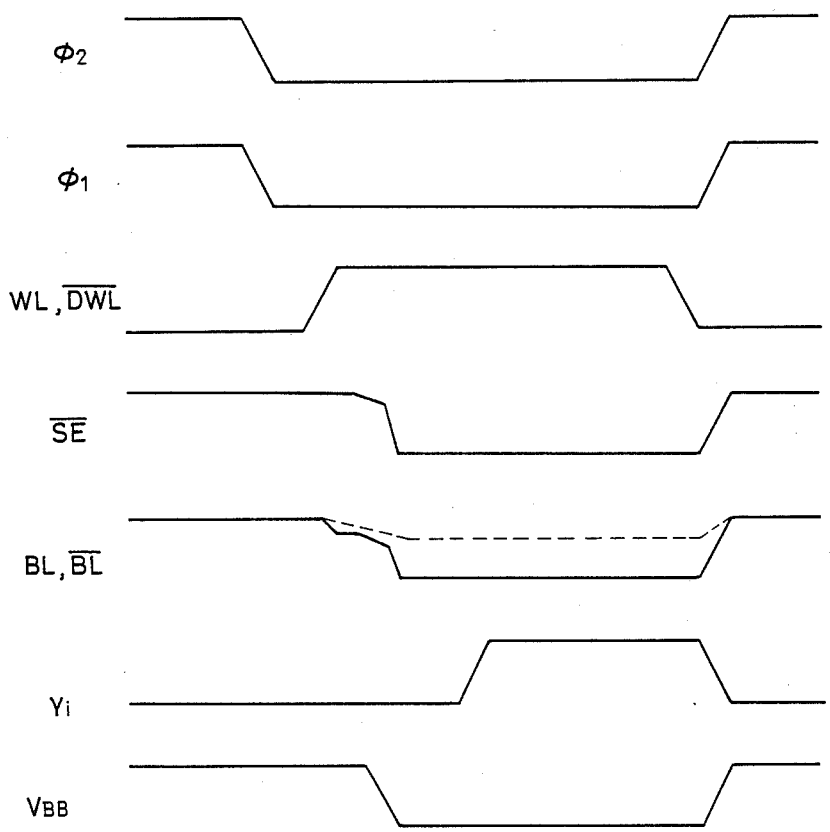
FIG. 3 is a timing chart for explaining the operation of the memory cell array shown in FIG. 2.
Figure 4:
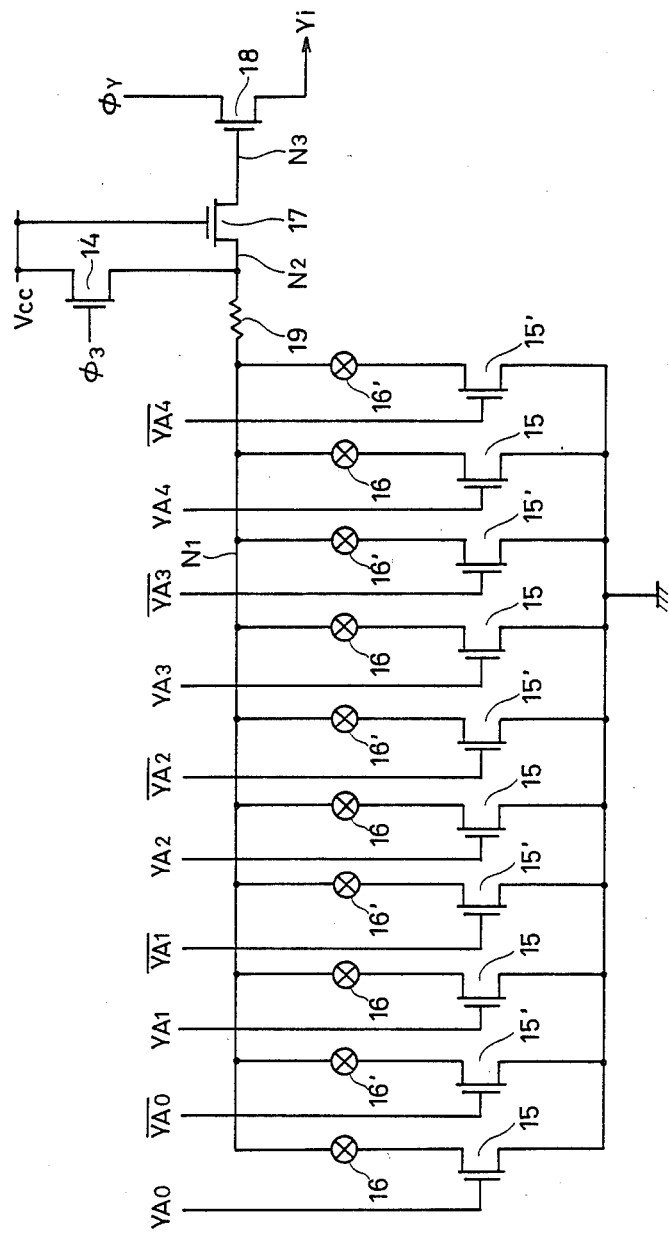
FIG. 4 is a circuit diagram showing a conventional spare Y decoder.

FIG. 1 is a circuit diagram showing an example of a spare Y decoder in a semiconductor memory in accordance with an embodiment of the present invention. The same reference characters as in FIG. 4 denote the same portions. A feature of this embodiment resides in that a MOS transistor for charge is further provided. The structure of the other portions is the same as in the circuit shown in FIG. 4. The MOS transistor 20 for charge is provided between the power supply line Vcc and the node N1. A clock signal $\phi 3$ is applied to the gate of the MOS transistor 20.

Since the MOS transistor 20 for charge is further provided in the spare Y decoder of this embodiment, the node N1 can be charged directly by the MOS transistor 20 instead of using the MOS transistor 14 and the parasitic resistor 19 as in a conventional example.

Accordingly, if the rise of the clock signal $\phi 3$ and the bounce of the substrate potential VBB in the positive direction occur concurrently, the node N1 can be charged rapidly in the same manner as in the node N2. More specifically, the potential of the node N3 to be charged can be sufficiently assured since the charging capacity is increased and in addition, since the potential of the node N3 increased by the self-bootstrap effect is not lowered at the time of selection and the potential of the decode output Yi of the spare Y decoder can be maintained for a long period, writing in and reading out of the bit lines can be performed easily and a wide margin of application of timing in operation can be assured.

Although an example using two MOS transistors for charge was shown in the above described embodiment, the MOS transistors for charge may be 3 or more. In brief, it is the best way to provide a MOS transistor for each node to be charged.

In addition, although an NMOS structure was shown in the above described embodiment, a PMOS structure or a CMOS structure may be adopted. In such cases, clock signals and power supply lines may be changed suitably.

Further, although an example of a spare Y decoder provided with a plurality of charging transistors was shown in the above described embodiment, a wide timing margin of operation can also be assured if a spare X decoder is provided with a plurality of charging transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory of a redundant design having a spare decoder and a regular decoder, characterized in that:
   a plurality of charging means are provided in said spare decoder, each said charging means comprising a switched constant voltage source.

2. A semiconductor memory in accordance with claim 1, comprising:
a memory cell array in which memory cells are regularly arrayed and an arbitrary memory cell can be specified by a column address and a row address,
said spare decoder being located outside said memory cell array, said semiconductor memory having a parasitic resistor connected between said spare decoder and said memory cell array, and
said charging means being provided on both sides of said parasitic resistor.

3. A semiconductor memory in accordance with claim 2, wherein
said spare decoder is a spare column decoder for decoding said column address of said memory cell array.

4. A semiconductor memory in accordance with claim 2, wherein said spare decoder is a spare row decoder for decoding said row address of said memory cell array.

5. A semiconductor memory of a redundant design comprising:
a memory cell array in which a plurality of memory cells are regularly arrayed along a plurality of word lines and a plurality of bit lines perpendicular to said word lines and an arbitrary one of said memory cells can be specified by the combination of a column address and a row address,
reading means for selecting one of said word lines by said row address to read out onto said bit lines, an information charge of the memory cells connected to said selected one of said word lines,
means for selecting one of said bit lines by said column address to provide to a device located external to said semiconductor memory the information charge amplified by said sense amplifier connected to said selected one of said bit lines, and
a spare column decoder for selecting a spare bit line when a column address corresponding to a defective bit line is applied,
said semiconductor memory being characterized in that a plurality of charging means are provided in said spare column decoder, each said charging means comprising a switched constant voltage source.

6. A semiconductor memory in accordance with claim 5, having
a parasitic resistor connected between said column decoder and said memory cell array, and
said charging means are provided on both sides of said parasitic resistor.

* * * * *

UNITED STATES PATENT AND TRADEMARK OFFICE
CERTIFICATE OF CORRECTION

PATENT NO. : 4,734,889

DATED : March 29, 1988

INVENTOR(S) : Mashiko, et al.

Figure 5:
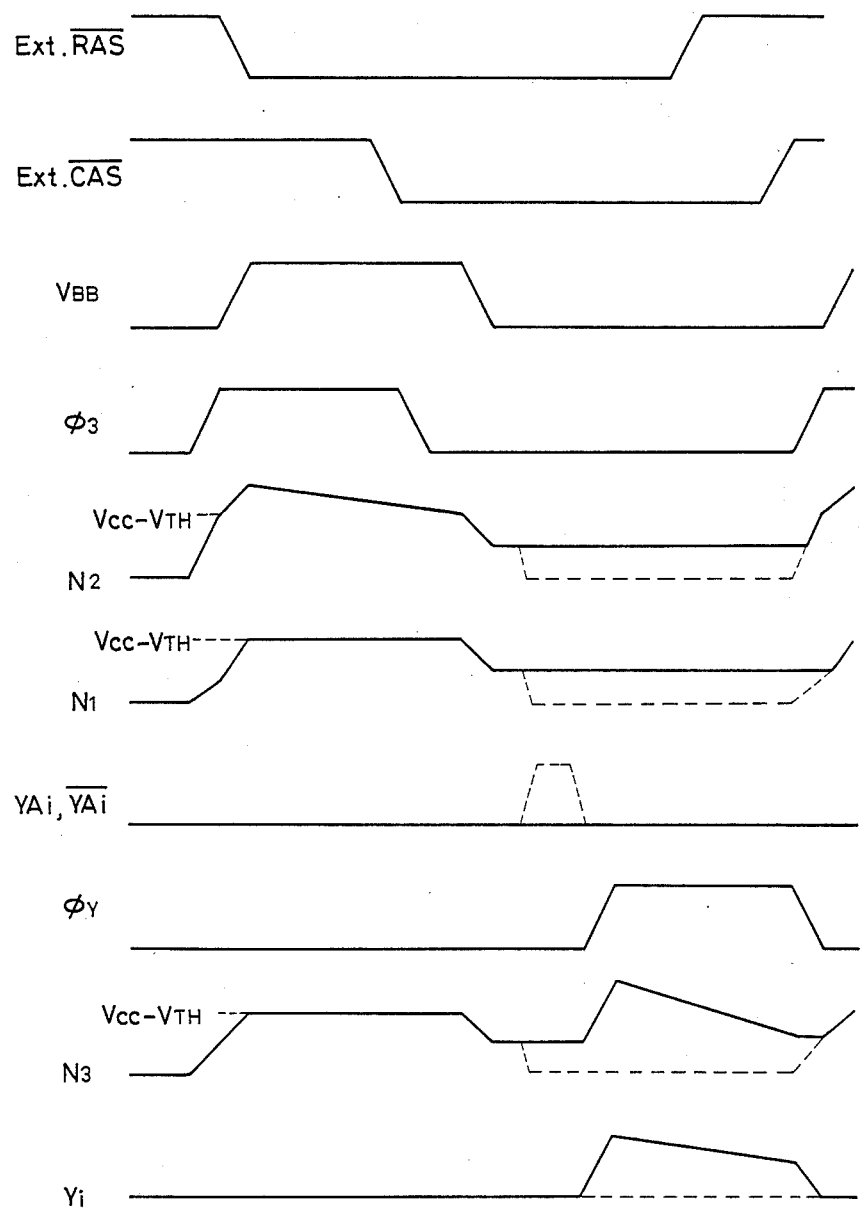
FIG. 5 is a timing chart for explaining the operation of the spare Y decoder shown in FIG. 4.
Figure 5:
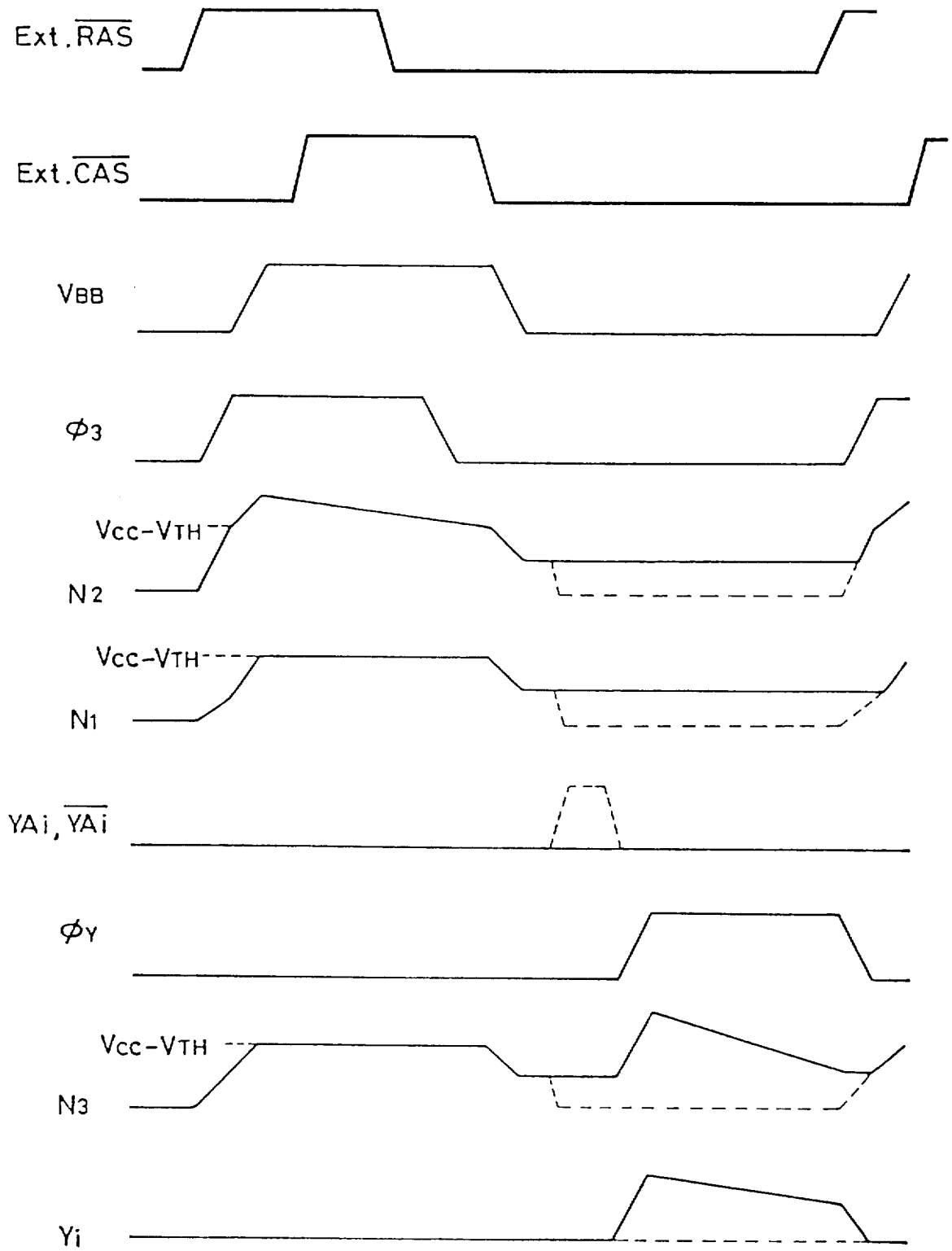

It is certified that error appears in the above-identified patent and that said Letters Patent is hereby corrected as shown below:

Delete Figure 5 and insert the following Figure 5, as shown on the attached page.

Signed and Sealed this

Thirtieth Day of May, 1989

Attest:

DONALD J. QUIGG

Attesting Officer

Commissioner of Patents and Trademarks